United States Patent
Akram

(10) Patent No.: US 6,338,880 B1
(45) Date of Patent: *Jan. 15, 2002

(54) CHEMICAL VAPOR DEPOSITION PROCESS FOR DEPOSITING TITANIUM NITRIDE FILMS FROM AN ORGANOMETALLIC COMPOUND

(75) Inventor: Salman Akram, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/148,373

(22) Filed: Sep. 4, 1998

(51) Int. Cl.[7] .............................................. C23C 16/34
(52) U.S. Cl. ................ 427/575; 427/576; 427/255.394; 438/681; 438/685
(58) Field of Search .......................... 427/576, 255.394, 427/575; 438/681, 685

(56) References Cited

U.S. PATENT DOCUMENTS 4,782,380 A * 11/1988 Shankar et al.
5,254,499 A * 10/1993 Sandhu et al.

OTHER PUBLICATIONS

Pierson, Handbook of Chemical Vapor Deposition, Noyes Publications, Park Ridge, New Jersey, pp. 60–61 (no month), 1992.*

Pierson, Thin Solid Films, vol. 45, pp. 257–263 (no month), 1977.*

Bunshah et al., Deposition Technologies for Films and Coatings, Noyes Publications, Park Ridge, New Jersey, U.S.A., (1982), p. 366 (no month available).*

* cited by examiner

Primary Examiner—Timothy Meeks
(74) Attorney, Agent, or Firm—TraskBritt

(57) ABSTRACT

A process for depositing titanium nitride films containing less than 5% carbon impurities and less than 10% oxygen impurities by weight via chemical vapor deposition is disclosed. Sheet resistance of the deposited films is generally be within a range of about 1 to 10 ohms per square. The deposition process takes place in a deposition chamber that has been evacuated to less than atmospheric pressure and utilizes the organometallic compound tertiary-butyltris-dimethylamido-titanium and a nitrogen source as precursors. The deposition temperature, which is dependent on the nitrogen source, is within a range of 350° C. to 700° C. The low end of the temperature range utilizes nitrogen-containing gases such as diatomic nitrogen, ammonia, hydrazine, amides and amines which have been converted to a plasma. The higher end of the temperature range relies on thermal decomposition of the nitrogen source for the production of reaction-sustaining radicals. In such a case, the use of diatomic nitrogen gas is precluded because of its high dissociation temperature. Other materials may be simultaneously incorporated in the titanium nitride films during either embodiment of the deposition process as heretofore described. For example, a titanium nitride film incorporating aluminum and having the general formula TiAlN may be deposited by introducing aluminum-containing compounds. Additionally, a titanium nitride film incorporating tungsten and having the general formula TiNW may be deposited by introducing tungsten-containing compounds.

28 Claims, 2 Drawing Sheets

CHEMICAL VAPOR DEPOSITION PROCESS FOR DEPOSITING TITANIUM NITRIDE FILMS FROM AN ORGANOMETALLIC COMPOUND

RELATED APPLICATIONS

This application is related to Application Serial No. 09/148,371, titled CHEMICAL VAPOR DEPOSITION PROCESS FOR DEPOSITING TITANIUM SILICIDE FILMS FROM AN ORGANO-METALLIC COMPOUND, which was filed on Sep. 4,1998, now U.S. Pat. 6,168,837, issued Jan. 2, 2001.

BACKGROUND OF THE INVENTION

1. Field of the Invention

This invention relates to integrated circuit fabrication technology and, more specifically, to processes for depositing titanium nitride films via chemical vapor deposition.

2. Description of Related Art

The compound titanium nitride (TiN) has numerous potential applications because it is extremely hard, chemically inert (although it readily dissolves in hydrofluoric acid), an excellent conductor, possesses optical characteristics similar to those of gold, and has a melting point around 3000° C. This durable material has long been used to gild inexpensive jewelry and other art objects. However, during the last ten to twelve years, important uses have been found for TiN in the field of integrated circuit manufacturing. Not only is TiN unaffected by integrated circuit processing temperatures and most reagents, it also functions as an excellent barrier against diffusion of dopants between semiconductor layers. In addition, TiN also makes excellent ohmic contact with other conductive layers.

In a common application for integrated circuit manufacture, a contact opening is etched through an insulative layer down to a diffusion region to which electrical contact is to be made. Titanium metal is then sputtered over the wafer so that the exposed surface of the diffusion region is coated. The titanium metal is eventually converted to titanium silicide, thus providing an excellent conductive interface at the surface of the diffusion region. A titanium nitride barrier layer is then deposited, coating the walls and floor of the contact opening. Chemical vapor deposition of tungsten or polysilicon follows. In the case of tungsten, the titanium nitride layer provides greatly improved adhesion between the walls of the opening and the tungsten metal. In the case of the polysilicon, the titanium nitride layer acts as a barrier against dopant diffusion from the polysilicon layer into the diffusion region.

At least five processes are presently used for creating thin titanium nitride films: (1) reactive sputtering; (2) annealing of a sputter-deposited titanium layer in a nitrogen ambient; (3) a high-temperature atmospheric pressure chemical vapor deposition (APCVD) process, using titanium tetrachloride, nitrogen and hydrogen as reactants; (4) a low-temperature APCVD process, using ammonia and tetrakis-dialkylamido-titanium compounds which have the generic formula $Ti(NR_2)_4$ as precursors; and (5) a low-pressure chemical vapor deposition (LPCVD) process, using tetrakis-dialkylamido-titanium compounds as the sole precursor. FIG. 1 depicts the structural formula of tetrakis-dialkylamido-titanium. Each of the "R" groups may be as simple as a methyl group ($CH_3$—) or they may be more complex alkyl groups. Each of the processes enumerated above has its associated problems.

Both reactive sputtering and nitrogen ambient annealing of deposited titanium result in films having poor step coverage, which are not useable in submicron processes. Chemical vapor deposition processes have an important advantage in that conformal layers of any thickness may be deposited. This is especially advantageous in ultra-large-scale-integration circuits, where minimum feature widths may be smaller than 0.3 $\mu$m. Layers as thin as 10 Å may be readily produced using CVD. However, TiN coatings prepared using the high-temperature APCVD process must be prepared at temperatures between 900–1000° C. The high temperatures involved in this process are incompatible with conventional integrated circuit manufacturing processes. Hence, depositions using the APCVD process are restricted to refractory substrates such as tungsten carbide. The low-temperature APCVD, on the other hand, though performed within a temperature range of 100–400° C. that is compatible with conventional integrated circuit manufacturing processes, is problematic because the precursor compounds (ammonia and $Ti(NR_2)_4$) react spontaneously in the gas phase. Consequently, special precursor delivery systems are required to keep the gases separated during delivery to the reaction chamber. In spite of special delivery systems, the highly spontaneous reaction makes full wafer coverage difficult to achieve. Even when achieved, the deposited films tend to lack uniform conformality, are generally characterized by poor step coverage, and tend to deposit on every surface within the reaction chamber, leading to particle problems. A problem with the LPCVD process is that the deposited TiN films are high in carbon content even if the precursor is limited to tetrakis-dialkylamido- titanium, the compound of the group which contains the fewest carbon atoms. The carbon atoms within the precursor molecules are incorporated into the film as the precursor molecules dissociate. Although it is possible to reduce the carbon content of the films by annealing them in ammonia and nitrogen gases, the films attain neither the purity nor the conductivity of sputtered films.

What is needed is a new chemical vapor deposition process which will provide highly conformal TiN films of high purity and with step coverage that is suitable for sub-0.25 $\mu$m generations of integrated circuits.

SUMMARY OF THE INVENTION

This invention includes various processes for depositing titanium nitride films containing less than 5 percent carbon impurities and less than 10 percent oxygen impurities by weight via chemical vapor deposition and the use of a metal-organic precursor compound. Sheet resistance of the deposited films is within a range of about 1 to 10 ohms per square. The deposition process takes place in a deposition chamber that has been evacuated to less than atmospheric pressure and utilizes the organo-metallic compound tertiary-butyltris-dimethylamido-titanium (TBTDMAT) and a nitrogen source as precursors. The compound tertiary-butyltris-dimethylamido-titanium has the formula $(CH_3)_3CTi(N(CH_3)_2)_3$. FIG. 2 depicts the structural formula of tertiary-butyltris- dimethylamido-titanium. It will be noted that one dimethylamido group of the tetrakis-dimethylamido-titanium molecule has been replaced with a tertiary butyl group. The tertiary butyl group is more easily removed from the molecule not only because it is larger than the dimethyl amido group, but because the carbon-titanium bond is weaker than the nitrogen-titanium bonds. The resultant molecule is more reactive than tetrakis-dimethylamido-titanium and, in a chemical vapor deposition reaction, should produce films having a lower percentage of carbon impurities. The deposition temperature, which is dependent on the nitrogen source, is within a range of 350° C. to 700° C. The low end of the temperature range utilizes nitrogen-containing gases such as diatomic nitrogen, ammonia, amides, amines and hydrazine which have been converted to a plasma. The higher end of the temperature range relies on thermal decomposition of the nitrogen source for the production of reaction-sustaining radicals. In such a case, the use of diatomic nitrogen gas is precluded because of its high dissociation temperature.

Other materials may be incorporated in the titanium nitride films during either embodiment of the deposition process as heretofore described. For example, a titanium nitride film incorporating aluminum and having the general formula TiAlN may be deposited by introducing aluminum-containing compounds such as aluminum chloride ($AlCl_3$) dimethylethylamidoalane (DMEAA) or dimethylaluminum-hydride (DMAH) along with the TBTDMAT and nitrogen-containing compounds. Additionally, a titanium nitride film incorporating tungsten and having the general formula TiNW may be deposited by introducing tungsten halide compounds such as $WF_6$ or $WCl_6$ or an organo-metallic compound such as bis(2,4-dimethylpentadienyl)tungsten along with the TBTDMAT and silicon-containing compounds. The aluminum-containing compounds or tungsten-containing compounds may be introduced in a manner similar to that of the other reactants using the temperature guidelines heretofore provided for each embodiment of the invention.

PREFERRED EMBODIMENT OF THE INVENTION

A new low-pressure chemical vapor deposition process for depositing highly conformal titanium nitride films having carbon impurities of less than 5% by weight and oxygen impurities of less than 10% by weight and having sheet resistance values within a range of about 1 to 10 ohms per square will be described in reference to the low-pressure chemical vapor deposition reactor system depicted in FIG. 3.

A first embodiment of the invention which utilizes a cold-wall plasma enhanced chemical vapor deposition (PECVD) process will be described with reference to FIG. 3. Although the following description of the process represents what the inventor believe is the preferred embodiment of the process, the process may be practiced in either cold-wall or hot-wall plasma-enhanced chemical vapor deposition chambers, with or without premixing of the reactants. Furthermore, although the invention is directed to a technique for depositing conformal titanium nitride layers for use in the manufacture of integrated circuits, the process is also applicable to the deposition of titanium nitride on substrates other than semiconductor wafers.

Figure 1:
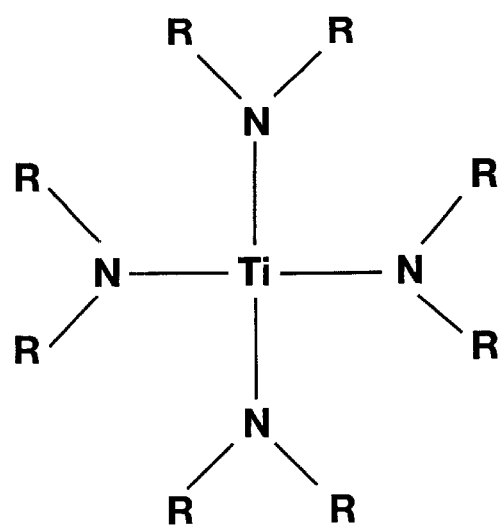
FIG. 1 is a structural diagram of tetrakis-dialkylamido-titanium.
Figure 2:
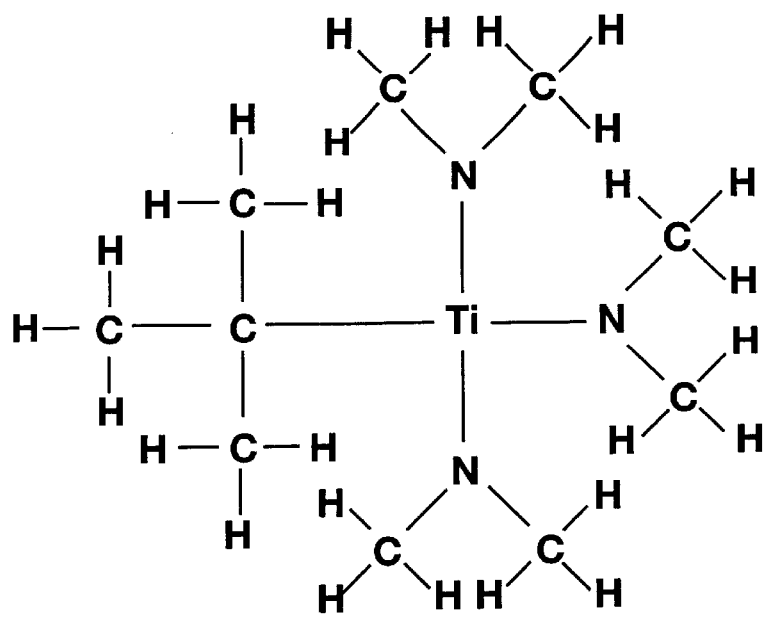
FIG. 2 is a structural diagram of tertiary-butyltris-dialkylamido-titanium.
Figure 3:
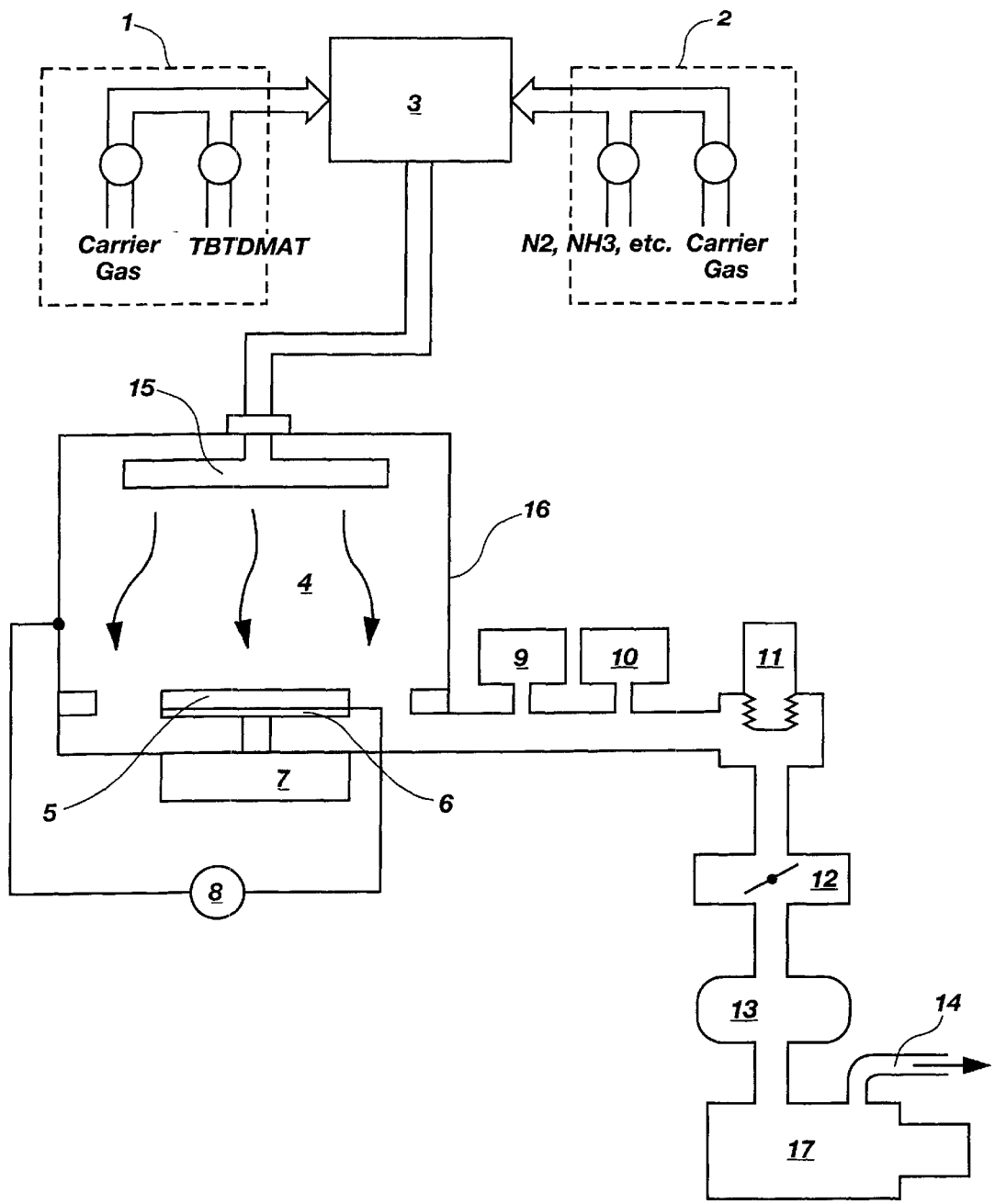
FIG. 3 is a block schematic diagram of a low-pressure chemical vapor deposition reactor system.

Referring now to FIG. 3, a tertiary-butyltris-dimethylamido-titanium metal-organic source gas is produced by heating liquid tertiary-butyltris-dimethylamido-titanium (the metal-organic precursor compound). The gas phase metal-organic compound transported by a carrier gas is admitted into a pre-mixing chamber 3 through control valve 1 and a nitrogen-containing gas such as $N_2$, $NH_3$, a hydrazine, an amide or an amine (or some combination thereof) is admitted into the pre-mixing chamber 3 through control valve 2. Use of a carrier gas may also be desired for the transport of certain amides or amines. The carrier gases employed may be $H_2$, $N_2$, He or Ar. In the case where $N_2$ is utilized as a carrier gas for the metal-organic compound, no other nitrogen-containing gas is required. Following the pre-mixing of the gas phase metal-organic compound and the nitrogen-containing compound in pre-mixing chamber 3, the pre-mixed gases are admitted to the deposition chamber 4. Optionally, the gas-phase metal-organic compound may be mixed with an inert carrier gas by bubbling the carrier gas through the heated metal-organic compound. As a further option, the liquid metal-organic compound may be converted to a fine spray or mist by a liquid injector (not shown). The mist is then passed through a vaporizer chamber (also not shown) en route to the deposition chamber. Within the deposition chamber 4, a semiconductor wafer 5 is heated to a temperature within a range of about 350° C. to 500° C. by convection from substrate holder 6 (such as a graphite or alumina boat) that, in turn, is heated via halogen lamps 7. The walls of the chamber are maintained at a temperature which is sufficiently high to prevent condensation of TBTDMAT molecules thereon, yet not so high that decomposition of TBTDMAT molecules will occur. In a cold-wall reactor, the wafer is maintained at a temperature that is considerably higher than that of the chamber walls, thereby minimizing deposition of titanium nitride on the chamber walls. As a general rule, the chamber walls should be maintained within a range of about 50° C. to 400° C., and optimally within a range of about 100° C. to 200° C.

Still referring to FIG. 3, the pre-mixed combination of metal-organic compound, one or more carrier gases and molecules of a nitrogen-containing gas such as $N_2$, $NH_3$, hydrazine, amides and amines enter deposition chamber 4 through shower head 15. A radio-frequency (RF) voltage, supplied by radio-frequency generator 8, is applied between substrate holder 6 and deposition chamber wall 16, thus forming a plasma in which some of the metal-organic molecules and nitrogen-containing molecules are converted to radicals, ions and metastables. An RF power density of about 1 to 2 watts/$cm^2$ is applied to the wafer in order to generate the plasma. Other remote plasma generation systems, such as a microwave plasma generator, can also be used with comparable results. Metal-organic compound molecules are adsorbed on the surface of the wafer 5, and nitrogen-containing radicals react with the adsorbed metal-organic molecules to form a uniformly thick titanium nitride layer on the surface of the wafer.

As an alternative to the procedure employed above for the first embodiment of the process, a remote source PECVD reactor may be employed with similar results. In such a case, only the nitrogen-containing gas need be passed through the plasma generator; the metal-organic compound may bypass the plasma generator en route to the deposition chamber 4.

Although the desired reaction may be effected at a pressure within a range of about 0.1 torr to 100 torr, a preferred range is deemed to be about 0.2 torr to 10 torr. A constant deposition pressure within that preferred range is monitored and maintained by conventional pressure control components consisting of pressure sensor 9, pressure switch 10, air operating vacuum valve 11 and pressure control valve 12. The byproducts of the reaction and the carrier gases (if carrier gases are used) pass through particulate filter 13 and escape through exhaust vent 14 with the aid of a blower 17 to complete the process.

The deposited titanium nitride films can be annealed in a nitrogen-containing ambiance at temperatures within a range of 400° C. to 700° C. Additionally, the deposited films can be annealed in a plasma environment, which typically reduces carbon and oxygen impurities in the films, thereby decreasing resistivity of the films by as much as 50 percent.

A second embodiment of the invention will also be described with reference to the diagrammatic representation of the chemical vapor deposition chamber of FIG. 3. However, for this embodiment, no RF power is applied between the substrate holder 6 and the chamber wall 16. Instead, increased wafer temperature is relied on to effect a reaction between the tertiary-butyltris-dimethylamido-titanium and the nitrogen-containing gas. Diatomic nitrogen gas, because its dissociation temperature is greater than temperatures compatible with semiconductor processing, is not used for the second embodiment of the process. Except for the use of higher temperatures within a range of about 500° C. to 700° C. and the lack of a plasma-generating RF power, other features of the process remain the same.

Other materials may be simultaneously incorporated in the titanium nitride films during either embodiment of the deposition process as heretofore described. For example, a titanium nitride film incorporating aluminum and having the general formula TiAlN may be deposited by introducing aluminum-containing compounds such as aluminum chloride ($AlCl_3$) dimethylethylamidoalane (DMEAA) or dimethylaluminum-hydride (DMAH) along with the TBT-DMAT and nitrogen-containing compounds. The aluminum-containing compound may be introduced in a manner similar to that of the other reactants using the temperature guidelines heretofore provided for each embodiment of the invention. Additionally, a titanium nitride film incorporating tungsten and having the general formula TiWN may be deposited by introducing organo-metallic compounds such bis(2,4-dimethylpentadienyl)tungsten or tungsten halide compounds such as $WF_6$ or $WCl_6$ along with the TBTDMAT and silicon-containing compounds. The aluminum-containing compounds or the tungsten-containing compounds may be introduced in a manner similar to that of the other reactants using the temperature guidelines heretofore provided for each embodiment of the invention.

While several embodiments of the process for depositing titanium nitride using tertiary-butyltris-dimethylamido-titanium as a precursor compound have been disclosed herein, it will be obvious to those having ordinary skill in the art that modifications and changes may be made thereto without affecting the scope and spirit of the invention as claimed.

What is claimed is:

1. A process for forming a predominantly titanium nitride film having less than about 5% carbon impurities by weight and a sheet resistance of approximately 1 to 10 ohms per square on a substrate, said process comprising:

placing the substrate within a chemical vapor deposition chamber maintained at a sub-atmospheric pressure;

premixing a tertiary-butyltris-dimethylamido-titanium and a nitrogen-containing gas in a premixing chamber;

admitting the premixed gas-phase tertiary-butyltris-dimethylamido-titanium and nitrogen-containing gas into said chemical vapor deposition chamber;

applying a plasma generation system to convert said tertiary-butyltris-dimethylamido-titanium and said nitrogen-containing gas into radicals, ions and metastables;

heating said substrate to a temperature ranging from about 350° C. to about 700° C.; and forming said predominantly titanium nitride film having less than about 5% carbon impurities by weight and an as deposited sheet resistance of approximately 1 to 10 ohms per square on said substrate.

2. The process of claim 1, wherein said placing the substrate within a chemical vapor deposition chamber maintained at a sub-atmospheric pressure comprises placing a semiconductor material selected from the group consisting of silicon, germanium, and gallium arsenide.

3. The process of claim 1, wherein said admitting nitrogen-containing gas into said chemical vapor deposition chamber comprises admitting a nitrogen-containing gas selected from the group consisting of ammonia, amides, amines, and hydrazine into said chemical vapor deposition chamber.

4. The process of claim 1, further comprising transporting said gas-phase tertiary-butyltris-dimethylamido-titanium to said chemical vapor deposition chamber using a carrier gas.

5. The process of claim 4, wherein said transporting gas-phase tertiary-butyltris-dimethylamido-titanium to said chemical vapor deposition chamber using a carrier gas comprises transporting said gas-phase tertiary-butyltris-dimethylamido-titanium to said chemical vapor deposition chamber using a carrier gas selected from the group consisting of $N_2$, $H_2$, He and Ar.

6. The process of claim 1, further comprising transporting said nitrogen-containing gas to said chemical vapor deposition chamber using a carrier gas.

7. The process of claim 1, wherein said forming a predominantly titanium nitride film having less than about 5% carbon impurities by weight and a sheet resistance of approximately 1 to 10 ohms per square further comprises forming the predominantly titanium nitride film comprising less than 10% oxygen impurities by weight.

8. The process of claim 1, wherein said placing the substrate within a chemical vapor deposition chamber maintained at sub-atmospheric pressure comprises placing a semiconductor wafer within a chemical vapor deposition chamber maintained at sub-atmospheric pressure.

9. The process of claim 1, further comprising admitting an aluminum-containing compound into said chemical vapor deposition chamber in combination with said gas-phase tertiary butyltris-dimethylamido-titanium and said nitrogen-containing gas for incorporating aluminum into said predominantly titanium nitride film having less than about 5% carbon impurities by weight.

10. The process of claim 9, wherein said admitting an aluminum-containing compound into said chemical vapor deposition chamber in combination with said gas-phase tertiary butyltris-dimethylamido-titanium and said nitrogen-containing gas comprises admitting $AlCl_3$ into said chemical vapor deposition chamber.

11. The process of claim 9, wherein said admitting an aluminum-containing compound into said chemical vapor deposition chamber in combination with said gas-phase tertiary butyltris-dimethylamido-titanium and said nitrogen-containing gas comprises admitting dimethylethylamidoalane into said chemical vapor deposition chamber.

12. The process of claim 9, wherein said admitting an aluminum-containing compound into said chemical vapor deposition chamber in combination with said gas-phase tertiary butyltris-dimethylamido-titanium and said nitrogen-containing gas comprises admitting dimethylaluminumhydride into said chemical vapor deposition chamber.

13. The process of claim 1, further comprising admitting a tungsten-containing compound into said chemical vapor deposition chamber in combination with said gas-phase tertiary-butyltris-dimethylamido-titanium and said nitrogen-containing gas for incorporating tungsten into said predominantly titanium nitride film having less than about 5% carbon impurities by weight.

14. The process of claim 13, wherein said admitting a tungsten-containing compound into said chemical vapor deposition chamber in combination with said gas-phase tertiary-butyltris-dimethylamido-titanium and said nitrogen-containing gas comprises admitting bis(2,4-dimethylpetadienyl)tungsten into said chemical vapor deposition chamber.

15. The process of claim 13, wherein said admitting a tungsten-containing compound into said chemical vapor deposition chamber in combination with said gas-phase tertiary-butyltris-dimethylamido-titanium and said nitrogen-containing gas comprises admitting a tungsten halide compound selected from the group consisting of $WF_6$ and $WCl_6$ into said chemical vapor deposition chamber.

16. The process of claim 1, further comprising annealing said predominantly titanium nitride film having less than about 5% carbon impurities by weight and a sheet resistance of approximately 1 to 10 ohms per square in a nitrogen ambiance.

17. The process of claim 1, wherein said plasma generation system is a radio-frequency generator.

18. The process of claim 1, wherein said plasma generation system is a microwave plasma generator.

19. A process for forming a predominantly titanium nitride film on a substrate, said process comprising:

placing the substrate within a plasma-enhanced chemical vapor deposition (PECVD) chamber maintained at a sub-atmospheric pressure;

admitting gas-phase tertiary-butyltris-dimethylamido-titanium into said PECVD chamber;

admitting nitrogen-containing gas into said PECVD chamber;

heating said substrate to a temperature within a range of about 350° C. to 700° C.;

generating a plasma in said PECVD chamber in the presence of said gas-phase tertiary-butyltris-dimethylamido-titanium and said nitrogen-containing gas, said plasma converting a portion of said gas-phase tertiary-butyltris-dimethylamido-titanium and a portion of said nitrogen-containing gas into radicals, ions and metastables; and depositing said predominantly titanium nitride film on said substrate, said predominantly titanium nitride film having an as deposited sheet resistance of approximately 1 to 10 ohms per square.

20. The process of claim 19, wherein said admitting nitrogen-containing gas into said PECVD chamber comprises admitting a nitrogen-containing gas selected from the groLIp consisting of diatomic nitrogen, ammonia, amides and amines.

21. The process of claim 19, wherein said depositing said predominantly titanium nitride film on said substrate comprises depositing a titanium nitride film containing less than 5% carbon impurities by weight and less than 10% oxygen impurities by weight.

22. The process of claim 19, further comprising admitting an aluminum-containing compound into said PECVD chamber in combination with said gas-phase tertiary-butyltris-dimethylamido-titanium and said nitrogen-containing gas.

23. The process of claim 22, wherein said admitting an aluminum-containing compound into said PECVD chamber in combination with said gas-phase tertiary-butyltris-dimethylamido-titanium and said nitrogen-containing gas comprises admitting $AlCl_3$ into said PECVD chamber.

24. The process of claim 22, wherein said admitting an aluminum-containing compound into said PECVD chamber in combination with said gas-phase tertiary-butyltris-dimethylamido-titanium and said nitrogen-containing gas comprises admitting dimethylcthylamidealane into said PECVD chamber.

25. The process of claim 22, wherein said admitting an aluminum-containing compound into said PECVD chamber in combination with said gas-phase tertiary-butyltris-dimethylamido-titanium and said nitrogen-containing gas comprises admitting dimethylaluminumhydride into said PECVD chamber.

26. The process of claim 19, further comprising admitting a tungsten-containing compound into said PECVD chamber in combination with said gas-phase tertiary-butyltris-dimethylamido-titanium and said nitrogen-containing gas, thereby incorporating tungsten into said predominantly titanium nitride film.

27. The process of claim 26, wherein said admitting a tungsten-containing compound into said PECVD chamber in combination with said gas-phase tertiary-butyltris-dimethylamido-titanium and said nitrogen-containing gas comprises admitting bis(2,4-dimethylpetadienyl)tungstcn into said PECVD chamber.

28. The process of claim 26, wherein said admitting a tungsten-containing compound into said PECVD chamber in combination with said gas-phase tertiary-butyltris-dimethylamido-titanium and said nitrogen-containing gas comprises admitting a tungsten halide compound selected from the group consisting of $WF_6$ and $WCl_6$ into said PECVD chamber.

* * * * *

UNITED STATES PATENT AND TRADEMARK OFFICE
CERTIFICATE OF CORRECTION

PATENT NO. : 6,338,880 B1  
DATED : January 15, 2002  
INVENTOR(S) : Salman Akram It is certified that error appears in the above-identified patent and that said Letters Patent is hereby corrected as shown below:

<u>Title page,</u>  
Item [57], ABSTRACT,  
Line 4, after "generally" delete "be"  
Line 23, change "TiAlN" to -- TiAlN --

<u>Column 3,</u>  
Line 15, change "TiAlN" to -- TiAlN --

<u>Column 5,</u>  
Line 25, change "TiAlN" to -- TiAlN --

<u>Column 6,</u>  
Lines 2-3, change "an as deposited" to -- a --

<u>Column 8,</u>  
Line 2, change "groLIp" to -- group --  
Line 18, change "dimethylcthylamidealane" to -- dimethylethylamidealane --  
Line 40, change ")tungstcn" to -- )tungsten --

Signed and Sealed this

Twenty-ninth Day of July, 2003

JAMES E. ROGAN  
*Director of the United States Patent and Trademark Office*